United States Patent
Li et al.

(10) Patent No.: US 10,803,823 B2
(45) Date of Patent: Oct. 13, 2020

(54) SHIFT REGISTER UNIT, GATE DRIVING CIRCUIT, AND DRIVING METHOD

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Meng Li, Beijing (CN); Yongqian Li, Beijing (CN); Pan Xu, Beijing (CN); Miao Zhang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 124 days.

(21) Appl. No.: 15/772,677

(22) PCT Filed: Sep. 15, 2017

(86) PCT No.: PCT/CN2017/101848
§ 371 (c)(1),
(2) Date: May 1, 2018

(87) PCT Pub. No.: WO2018/171133
PCT Pub. Date: Sep. 27, 2018

(65) Prior Publication Data
US 2019/0156778 A1 May 23, 2019

(30) Foreign Application Priority Data

Mar. 20, 2017 (CN) .......................... 2017 1 0166678

(51) Int. Cl.
*G09G 3/36* (2006.01)
*G11C 19/28* (2006.01)

(52) U.S. Cl.
CPC ........... *G09G 3/3677* (2013.01); *G11C 19/28* (2013.01); *G09G 2310/0267* (2013.01); *G09G 2310/0286* (2013.01); *G09G 2310/0289* (2013.01)

(58) Field of Classification Search
None
See application file for complete search history.

(56) References Cited

U.S. PATENT DOCUMENTS 8,823,628 B2  9/2014 Chung
9,898,958 B2  2/2018 Ma
(Continued)

FOREIGN PATENT DOCUMENTS

CN  1705042 A  12/2005
CN  1873763 A  12/2006
(Continued)

OTHER PUBLICATIONS

The First Chinese Office Action dated Oct. 12, 2018; Appln. No. 201710166678.0.
(Continued)

*Primary Examiner* — Kent W Chang
*Assistant Examiner* — Benjamin Morales

(57) ABSTRACT

The present application provides a shift register circuit, a gate driving circuit including the shift register circuit, and a driving method applied to the shift register circuit. The shift register circuit includes an input sub-circuit, an output sub-circuit, an output reset sub-circuit, and a first capacitor, wherein the first capacitor is connected between the pull-up node and the second clock signal terminal, and configured to maintain a high level at the pull-up node through the second clock signal input at the second clock signal terminal. The shift register circuit further includes a second capacitor connected between the pull-down node and a first voltage (Continued)

input terminal, and configured to pull down a level at the pull-down node through a reverse bias voltage input at the first voltage input terminal during a blanking time after a frame of scanning ends.

20 Claims, 9 Drawing Sheets

(56) References Cited

U.S. PATENT DOCUMENTS

| | | | |
|---|---|---|---|
| 2005/0008114 A1* | 1/2005 | Moon | G09G 3/3677 377/64 |
| 2005/0264514 A1* | 12/2005 | Kim | G11C 19/28 345/100 |
| 2007/0052658 A1* | 3/2007 | Kim | G09G 3/3677 345/100 |
| 2007/0296681 A1* | 12/2007 | Kim | G11C 19/184 345/100 |
| 2008/0218502 A1* | 9/2008 | Lee | G09G 3/3674 345/208 |
| 2009/0303211 A1* | 12/2009 | Hu | G11C 19/28 345/204 |
| 2010/0150302 A1* | 6/2010 | Tsai | G11C 19/28 377/79 |
| 2014/0133621 A1 | 5/2014 | Shang | |
| 2017/0076680 A1 | 3/2017 | Li et al. | |
| 2017/0092376 A1 | 3/2017 | Wang | |
| 2018/0190232 A1 | 7/2018 | Xue et al. | |
| 2018/0233209 A1 | 8/2018 | Ma | |

FOREIGN PATENT DOCUMENTS

| | | |
|---|---|---|
| CN | 101587752 A | 11/2009 |
| CN | 104282279 A | 1/2015 |
| CN | 104575419 A | 4/2015 |
| CN | 104715733 A | 6/2015 |
| CN | 105931602 A | 9/2016 |
| CN | 205564249 A | 9/2016 |
| CN | 106057143 A | 10/2016 |
| CN | 106486082 A | 3/2017 |
| CN | 106847221 A | 6/2017 |

OTHER PUBLICATIONS

The Second Chinese Office Action dated May 7, 2019; Appln. No. 201710166678.0.
International Search Report and Written Opinion dated Jan. 3, 2018; PCT/CN2017/101848.
European Search Report Application No. 17902276.9; dated Jul. 2, 2020.

* cited by examiner

SHIFT REGISTER UNIT, GATE DRIVING CIRCUIT, AND DRIVING METHOD

TECHNICAL FIELD

The present disclosure relates to the field of display technology, and particularly relates to a shift register circuit, a gate driving circuit comprising the shift register circuit, and a driving method applied to the shift register circuit.

BACKGROUND

In the field of display technology, the liquid crystal display is a commonly used flat panel display at present, the pixel array of the liquid crystal display usually includes a plurality of rows of gate lines and a plurality of columns of data lines that are interleaved. Driving of the gate lines may be completed by connecting an integrated circuit outside the liquid crystal panel. In recent years, with continuous improvement of the amorphous silicon thin film technique, a gate driving circuit may also be directly fabricated on a thin film transistor array substrate to constitute a GOA (Gate driver On Array) circuit to drive the gate lines. Since the GOA circuit can be directly fabricated around the liquid crystal display, manufacturing process is simplified, product cost is reduced, and integration of the liquid crystal display is increased, thereby the liquid crystal display tends to be thinner.

Design of the existing gate driving circuit is relatively complex, in which many clock signals and many thin film transistors are usually adopted, resulting in high circuit power consumption and large noise. In addition, in the existing gate driving circuit, in a frame of scanning, the circuit output terminal always maintains at a low level after outputting a high level, thus the pull-down node must always maintain at a high positive level so as to turn on the thin film transistor connected with the output terminal, thereby pulling down the level at the output terminal, such maintaining of a high positive level at the gate of the thin film transistor can easily tends to cause the threshold voltage of the thin film transistor to drift, which seriously affects normal display of the liquid crystal panel.

SUMMARY

In view of the above problem, the present disclosure provides a shift register circuit, a gate driving circuit comprising the shift register circuit, and a driving method applied to the shift register circuit. The shift register circuit has simple structure, full-swing output, low power consumption and low noise, and drifting of the threshold voltage of the thin film transistor input at the output terminal is restored, thereby normal display of the liquid crystal panel is maintained.

According to an aspect of the present disclosure, there is provided a shift register circuit, comprising: an input sub-circuit (101) connected among an input terminal, a first clock signal terminal, a first node and a second node, and configured to charge the first node and reset the second node under control of an input signal input at the input terminal and a first clock signal input at the first clock signal terminal; an output sub-circuit (102) connected among the first node, a second clock signal terminal and an output terminal, and configured to output a second clock signal input at the second clock signal terminal to the output terminal under control of a level at the first node; an output reset sub-circuit (103) connected between the second node and the output terminal, and configured to reset the output terminal under control of a level at the second node; and a first capacitor (C1) connected between the first node and the second clock signal terminal, and configured to maintain a high level at the first node through the second clock signal input at the second clock signal terminal.

Optionally, the shift register circuit further comprises: a second node control sub-circuit (104) connected between a reset terminal and the second node, and configured to charge the second node under control of a reset signal input at the reset terminal.

Optionally, the input sub-circuit (101) comprises: a first transistor (T1), a control electrode of the first transistor being connected to the first clock signal terminal, an input electrode of the first transistor being connected to the input terminal, and an output electrode of the first transistor being connected to the first node; and a second transistor (T2), a control electrode of the second transistor being connected to the first node, an input electrode of the second transistor being connected to a second voltage input terminal, and an output electrode of the second transistor being connected to the second node.

Optionally, the output sub-circuit (102) comprises: a third transistor (T3), a control electrode of the third transistor being connected to the first node, an input electrode of the third transistor being connected to the second clock signal terminal, and an output electrode of the third transistor being connected to the output terminal; and a third capacitor (C3) connected between the first node and the output terminal.

Optionally, the output reset sub-circuit (103) comprises: a fourth transistor (T4), a control electrode of the fourth transistor being connected to the second node, an input electrode of the fourth transistor being connected to the second voltage input terminal, and an output electrode of the fourth transistor being connected to the output terminal.

Optionally, the second node control sub-circuit (104) comprises: a fifth transistor (T5), a control electrode and an input electrode of the fifth transistor being connected to the reset terminal, and an output electrode of the fifth transistor being connected to the second node.

According to another aspect of the present disclosure, there is provided a gate driving circuit, comprising a plurality of stages of cascaded shift register circuits, wherein an output terminal of the shift register circuit in each stage is connected to a corresponding gate line, wherein the output terminal of the shift register circuit in a first stage is connected to the input terminal of the shift register circuit in a second stage, the output terminal of the shift register circuit in a last stage is connected to the reset terminal of the shift register circuit in the last but one stage; except the shift register circuit in the first stage, the output terminal of the shift register circuit in each stage is further connected to the reset terminal of the shift register circuit in a previous stage; except the shift register circuit in the last stage, the output terminal of the shift register circuit in each stage is further connected to the input terminal of the shift register circuit in a next stage; wherein the first clock signal terminal and the second clock signal terminal of the shift register circuit in an N-th stage are input with the first clock signal and the second clock signal, respectively, and the first clock signal terminal and the second clock signal terminal of the shift register circuit in an (N+1)-th stage are input with the second clock signal and the first clock signal, respectively, cycles of the first clock signal and the second clock signal are the same, and timing sequences of the first clock signal and the second clock signal are opposite.

According to still another aspect of the present disclosure, there is provided a driving method applied to the shift register circuit, the driving method comprising: inputting the input signal at the input terminal, inputting the first clock signal at the first clock signal terminal, so that the first node is charged to the first high level and the second node is reset; and inputting the second clock signal at the second clock signal terminal so that the output terminal outputs the second clock signal, enabling a level at the first node to be raised from the first high level to a second high level due to capacitor bootstrap effect, maintaining, by a first capacitor (C1), the second high level at the first node through the second clock signal input at the second clock signal terminal.

Optionally, the driving method applied to the shift register circuit further comprises: inputting a reset signal at the reset terminal so that the second node is charged to a high level, thus resetting a level at the output terminal.

According to the principle of the present disclosure, the shift register circuit has a small number of clock signals and a small number of thin film transistors, and has simple structure; the high level at the pull-up node can be maintained through the second clock signal input at the second clock signal terminal by using the first capacitor connected between the pull-up node and the second clock signal terminal, so that the shift register circuit has full-swing output, low power consumption, and low noise.

Optionally, the shift register circuit further comprises: a second capacitor (C2) connected between the second node and a first voltage input terminal, and configured to pull down a level at the second node through a reverse bias voltage input at the first voltage input terminal during a blanking time after a frame of scanning ends.

Optionally, the driving method applied to the shift register circuit further comprises: pulling down, by the second capacitor (C2), the level at the second node through a reverse bias voltage input at the first voltage input terminal during a blanking time after a frame of scanning ends.

According to the principle of the present disclosure, in the shift register circuit, during a blanking time after a frame of scanning ends, the level at the pull-down node can be pulled down through the reverse bias voltage input at the first voltage input terminal by using the second capacitor connected between the pull-down node and the first voltage input terminal, so that the control electrode of the thin film transistor connected to the output terminal and contained in the shift register circuit is in a negative level state, and drifting of the threshold voltage of the thin film transistor is restored, thereby normal display of the liquid crystal panel is maintained.

BRIEF DESCRIPTION OF THE DRAWINGS

In order to more clearly explain the technical solutions of the embodiments of the present disclosure, the drawings necessary for description of the embodiments will be briefly described below. It is obvious that the drawings in the following description are merely some embodiments of the present disclosure, those of ordinary skill in the art can also obtain other drawings based on these drawings without any creative work. The following drawings are not intended to be scaled according to actual dimensions, and the emphasis is on illustrating the gist of the present disclosure.

DETAILED DESCRIPTION OF THE EMBODIMENTS

Hereinafter, the technical solutions in the embodiments of the present disclosure will be described clearly and comprehensively in combination with the drawings, obviously, these described embodiments are only parts of the embodiments of the present disclosure, rather than all of the embodiments thereof. Based on the embodiments of the present disclosure, all the other embodiments obtained by those of ordinary skill in the art without paying creative efforts fall into the protection scope of the present disclosure.

Figure 1:
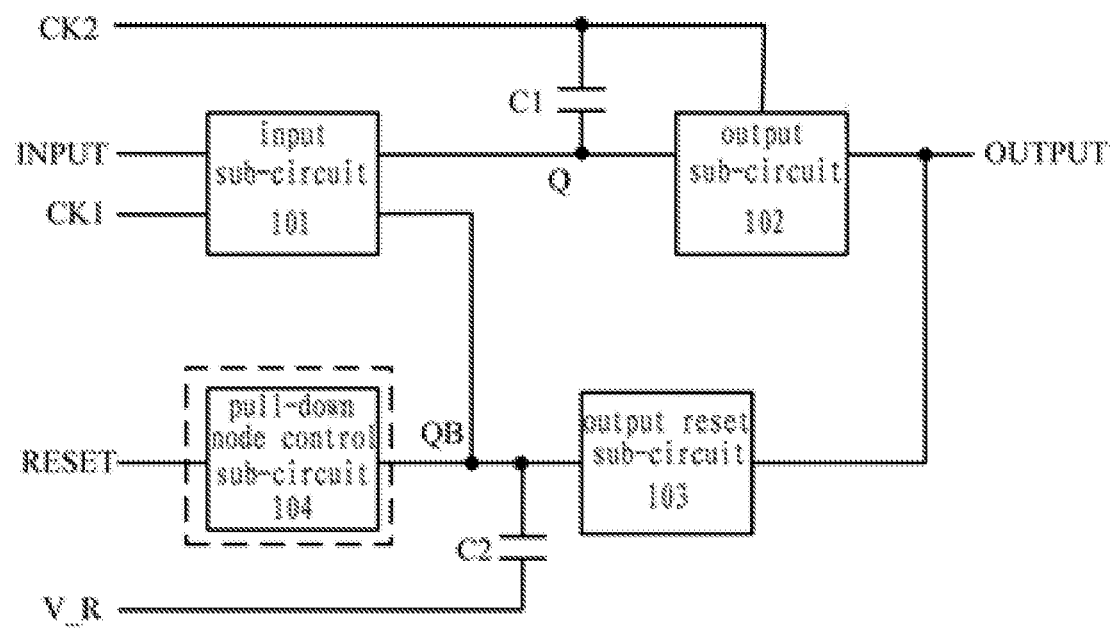
FIG. 1 is a block diagram of a shift register circuit according to an embodiment of the present disclosure.

FIG. 1 is a block diagram of a shift register circuit according to an embodiment of the present disclosure. As shown in FIG. 1, the shift register circuit comprises: an input sub-circuit 101 connected among an input terminal INPUT, a first clock signal terminal CK1, a pull-up node Q and a pull-down node QB, and configured to charge the pull-up node Q and reset the pull-down node QB under control of an input signal input at the input terminal INPUT and a first clock signal input at the first clock signal terminal CK1; an output sub-circuit 102 connected among the pull-up node Q, a second clock signal terminal CK2 and an output terminal OUTPUT, and configured to output a second clock signal input at the second clock signal terminal CK2 to the output terminal OUTPUT under control of a level at the pull-up node Q; an output reset sub-circuit 103 connected between the pull-down node QB and the output terminal OUTPUT, and configured to reset the output terminal OUTPUT under control of a level at the pull-down node QB; and a first capacitor C1 connected between the pull-up node Q and the second clock signal terminal CK2, and configured to maintain a high level at the pull-up node Q through the second clock signal input at the second clock signal terminal CK2.

Optionally, as shown in FIG. 1, the shift register circuit further comprises: a pull-down node control sub-circuit 104 connected between a reset terminal RESET and the pull-down node QB, and configured to charge the pull-down node QB under control of a reset signal input at the reset terminal RESET.

Optionally, as shown in FIG. 1, the shift register circuit further comprises: a second capacitor C2 connected between the pull-down node QB and a first voltage input terminal V_R, and configured to pull down a level at the pull-down node QB through a reverse bias voltage input at the first voltage input terminal V_R during a blanking time after a frame of scanning ends.

The shift register circuit according to the present disclosure has a small number of clock signals and a small number of thin film transistors, and has simple structure; the high level at the pull-up node Q can be maintained through the second clock signal input at the second clock signal terminal CK2 by using the first capacitor C1 connected between the pull-up node Q and the second clock signal terminal CK2, so that the shift register circuit has a full-swing output, low power consumption, and low noise; the level at the pull-down node QB can be pulled down through the reverse bias voltage input at the first voltage input terminal V_R by using the second capacitor connected between the pull-down node QB and the first voltage input terminal V_R during a blanking time after a frame of scanning ends, so that the control electrode of the thin film transistor connected to the output terminal OUTPUT and contained in the shift register circuit is in a negative level state, drifting of the threshold voltage of the thin film transistor is restored, thereby maintaining normal display of the liquid crystal panel.

Figure 2:
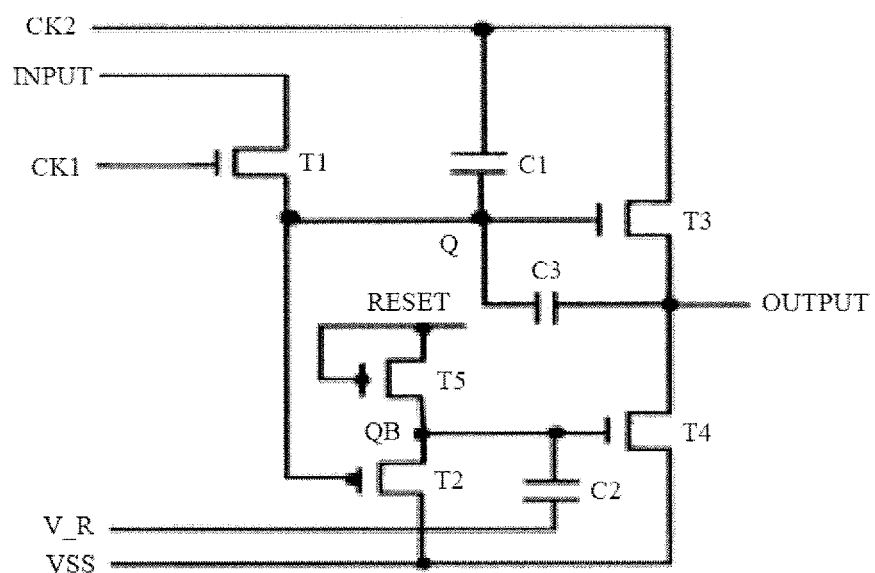
FIG. 2 illustrates circuit structure of a shift register circuit according to an embodiment of the present disclosure.

FIG. 2 illustrates schematic circuit structure of a shift register circuit according to an embodiment of the present disclosure. The circuit structure of the shift register circuit will be described in detail with reference to FIGS. 1 and 2. Optionally, as shown in FIG. 2, in the shift register circuit, the input sub-circuit 101 comprises: a first transistor T1, a control electrode of the first transistor being connected to the first clock signal terminal CK1, an input electrode of the first transistor being connected to the input terminal INPUT, and an output electrode of the first transistor being connected to the pull-up node Q; and a second transistor T2, a control electrode of the second transistor being connected to the pull-up node Q, an input electrode of the second transistor being connected to a second voltage input terminal VSS, and an output electrode of the second transistor being connected to the pull-down node QB.

Optionally, as shown in FIG. 2, in the shift register circuit, the output sub-circuit 102 comprises: a third transistor T3, a control electrode of the third transistor being connected to the pull-up node Q, an input electrode of the third transistor being connected to the second clock signal terminal CK2, and an output electrode of the third transistor being connected to the output terminal OUTPUT; and a third capacitor C3 connected between the pull-up node Q and the output terminal OUTPUT.

Optionally, as shown in FIG. 2, in the shift register circuit, the output reset sub-circuit 103 comprises: a fourth transistor T4, a control electrode of the fourth transistor being connected to the pull-down node QB, an input electrode of the fourth transistor being connected to the second voltage input terminal VSS, and an output electrode of the fourth transistor being connected to the output terminal OUTPUT.

Optionally, as shown in FIG. 2, in the shift register circuit, the pull-down node control sub-circuit 104 comprises: a fifth transistor T5, a control electrode and an input electrode of the fifth transistor being connected to the reset terminal RESET, and an output electrode of the fifth transistor being connected to the pull-down node QB.

Although each of the transistors shown in FIG. 2 is an N-type transistor, of which the control electrode is the gate of the N-type transistor, the input electrode is the drain of the N-type transistor, and the output electrode is the source of the N-type transistor; a reverse bias voltage is input at the first voltage input terminal V_R during the blanking time after the a frame of scanning ends, a low level is input at the second voltage input terminal VSS. However, in order to implement the principle of the present disclosure, it is also possible for one or more of the transistors in the shift register circuit to adopt a P-type transistor, only if positions of the source and the drain are adjusted accordingly, and levels input at the first voltage input terminal and the second voltage input terminal are adjusted accordingly. The details will not be described here, but they should also fall into the protection scope of the present disclosure.

Figure 3:
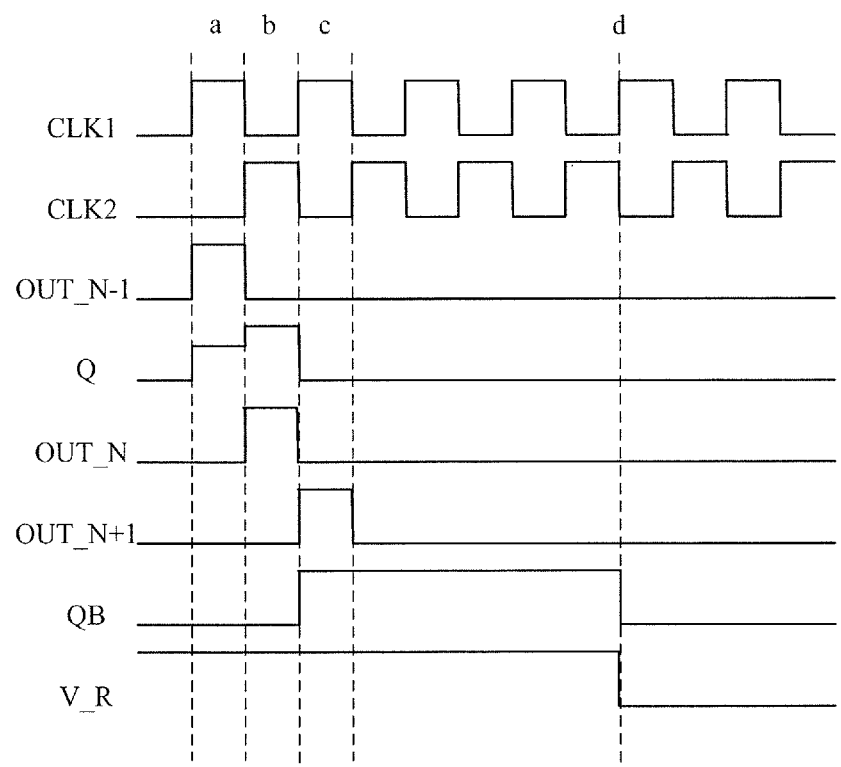
FIG. 3 illustrates timing of relevant signals in a shift register circuit that may be used in an embodiment of the present disclosure.

In the following, for example, taking the shift register circuit shown in FIG. 2 as the shift register circuit in an N-th stage, the concrete operation principle will be described with reference to the signal timing shown in FIG. 3, wherein the first clock signal CLK1 is input at the first clock signal terminal CK1 of the shift register circuit, the second clock signal CLK2 is input at the second clock signal terminal CK2 of the shift register circuit; a low level is input at the second voltage input terminal VSS; the input terminal INPUT is connected to the output terminal OUT-N−1 of the shift register circuit in a previous stage, the reset terminal RESET is connected to the output terminal OUT-N+1 of the shift register circuit in a next stage, that is, the scanning direction is a forwarding scanning. In the four phases indicated by a, b, c, and d shown in FIG. 3, the shift register circuit performs the following operations:

In a first phase a, the input signal OUT_N−1 of a high level is input at the input terminal INPUT, and the first clock signal CLK1 of a high level is input at the first clock signal terminal CK1, so that the transistor T1 is turned on, thereby charging the pull-up node Q to the first high level, the transistors T2 and T3 are turned on thus. Since the input electrode of the transistor T2 is connected to the second voltage input terminal VSS at a low level, the level at the pull-down node QB is reset, so that the transistor T4 is turned off; the second clock signal CLK2 of a low level is input at the second clock signal terminal CK2, so that the output terminal OUTPUT outputs the output signal OUT_N of a low level. In the first phase a, those skilled in the art should understand that the input signal of the shift register circuit in the first stage may be the initial input signal STU.

In the second phase b, the input signal OUT_N−1 of a low level is input at the input terminal INPUT, the first clock signal CLK1 of a low level is input at the first clock signal terminal CK1, so that the transistor T1 is turned off; the second clock signal CLK2 of a high level is input at the second clock signal terminal CK2, since the transistor T3 is kept turned on, the output terminal OUTPUT outputs the second clock signal CLK2 of a high level input at the second clock signal terminal as the output signal OUT_N, and because of bootstrap effect of the third capacitor C3, the level at the pull-up node Q rises from the first high level to the second high level; the transistor T2 maintains the turned-on state, so that the level at the pull-down node QB is still at a low level. Since there is a first capacitor C1 between the pull-up node Q and the second clock signal terminal CK2, even if there is a leakage current in the transistor T1, the second high level at the pull-up node Q can also be maintained by the first capacitor C1 through the second clock signal CLK2 of a high level input at the second clock signal terminal CK2. In this case, even if the first clock signal CLK1 and the second clock signal CLK2 are at a relatively low level, the transistor T3 can be fully turned on, so that the shift register circuit has a full-swing output, low power consumption, and low noise. The first capacitor C1 may be about 0.2 pF, so that the shift register circuit has low noise and avoids glitches on the output signal.

In the third phase c, the input signal OUT_N+1 of a high level is input at the reset terminal RESET, so that the transistor T5 is turned on, thereby charging the pull-down node QB to a high level, so that the transistor T4 is turned on; because the input terminal of the transistor T4 is connected to the second voltage input terminal VSS of a low level, the output signal OUT_N of the output terminal OUTPUT changes to a low level.

Figure 4:
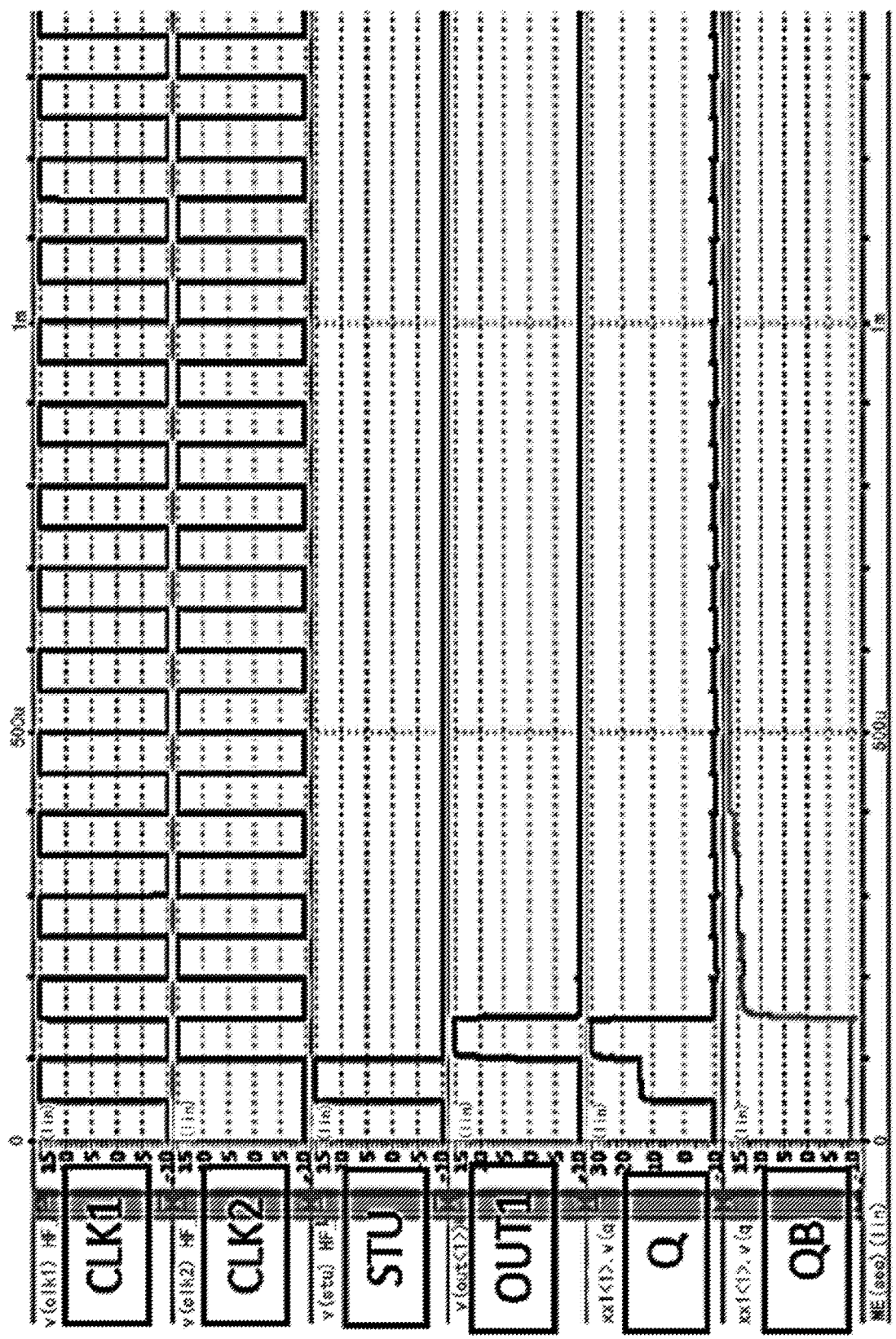
FIG. 4 is a design simulation diagram of a shift register circuit without adding a second capacitor and a first voltage input terminal.
Figure 5:
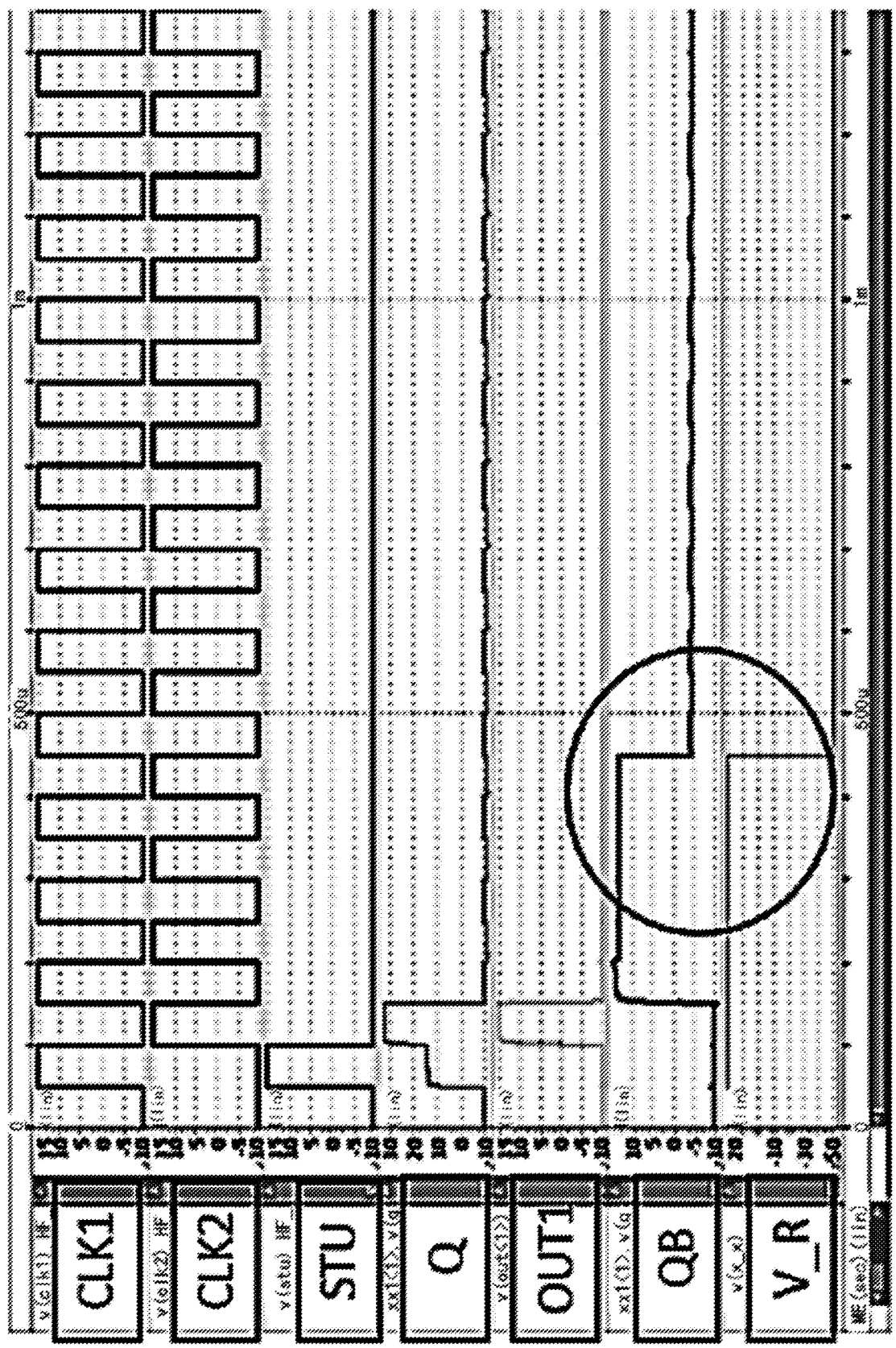
FIG. 5 is a design simulation diagram of a shift register circuit with a second capacitor and a first voltage input terminal added according to an embodiment of the present disclosure.

The fourth phase d is the blanking time after a frame of scanning of the shift register circuit ends. In the fourth phase d, the voltage input at the first voltage input terminal V_R changes from a forward bias voltage to a reverse bias voltage, since there is a second capacitor C2 between the pull-down node QB and the first voltage input terminal V_R, the level at the pull-down node QB can be pulled down by the second capacitor C2 through the reverse bias voltage input at the first voltage input terminal V_R, so that the control electrode of the transistor T4 is in a negative level state, which is contrary to the positive level state in the third phase c, thus drifting of the threshold voltage of the transistor T4 is restored, and normal display of the liquid crystal panel is maintained. FIG. 4 is a design simulation diagram of a shift register circuit without adding a second capacitor C2 and a first voltage input terminal V_R. FIG. 5 is a design simulation diagram of a shift register circuit with a second capacitor C2 and a first voltage input terminal V_R added according to an embodiment of the present disclosure. By comparing FIG. 4 with FIG. 5, it can be seen that the second capacitor C2 can pull down the level at the pull-down node QB, so that the control electrode of the transistor T4 is in a negative level state.

The shift register circuit according to the present disclosure has a small number of clock signals and a small number of thin film transistors, and has simple structure; the high level at the pull-up node Q can be maintained through the second clock signal input at the second clock signal terminal CK2 by using the first capacitor C1 connected between the pull-up node Q and the second clock signal terminal CK2, so that the shift register circuit has a full-swing output, low power consumption, and low noise; in the blanking time after a frame of scanning ends, the level at the pull-down node QB can be pulled down through the reverse bias voltage input at the first voltage input terminal V_R by using the second capacitor connected between the pull-down node QB and the first voltage input terminal V_R, so that the control electrode of the thin film transistor T4 connected to the output terminal OUTPUT and contained in the shift register circuit is in a negative level state, drifting of the threshold voltage of the thin film transistor T4 is restored, thereby normal display of the liquid crystal panel is maintained.

Figure 6:
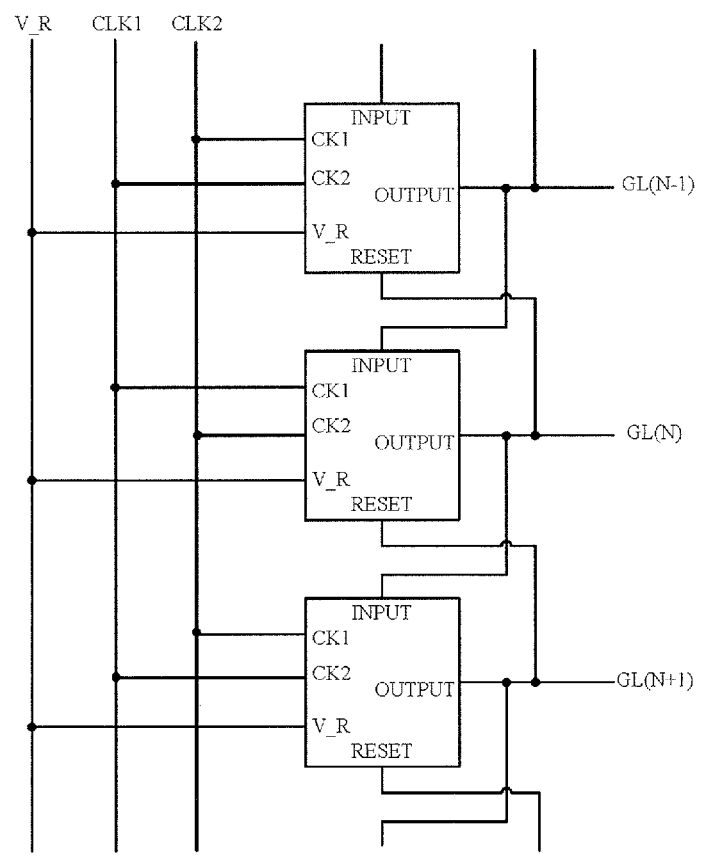
FIG. 6 is a schematic diagram of overall connection structure of a gate driving circuit according to an embodiment of the present disclosure.

According to another aspect of the present disclosure, there is provided a gate driving circuit. As shown in FIG. 6, the gate driving circuit comprises a plurality of stages of cascaded shift register circuits, the shift register circuit in each stage may adopt the structure of the shift register circuit as shown in FIGS. 1 and 2. As shown in FIG. 6, an output terminal OUTPUT of the shift register circuit in each stage is connected to a corresponding gate line; an output terminal OUTPUT of the shift register circuit in a first stage is connected to an input terminal INPUT of the shift register circuit in a second stage, an output terminal OUTPUT of the shift register circuit in a last stage is connected to a reset terminal RESET of the shift register circuit in the last but one stage; except the shift register circuit in the first stage, an output terminal OUTPUT of the shift register circuit in each stage is further connected to a reset terminal RESET of the shift register circuit in a previous stage; except the shift register circuit in the last stage, an output terminal OUTPUT of the shift register circuit in each stage is further connected to an input terminal INPUT of the shift register circuit in a next stage; that is to say, as for the shift register circuit in an N-th stage, the input terminal INPUT thereof is connected to an output terminal OUTPUT of the shift register circuit in an (N−1)-th stage, the reset terminal RESET thereof is connected to an output terminal OUTPUT of the shift register circuit in an (N+1)-th stage; wherein a first clock signal terminal CK1 and a second clock signal terminal CK2 of the shift register circuit in an N-th stage are connected to a first clock signal CLK1 and a second clock signal CLK2, respectively, and a first clock signal terminal CK1 and a second clock signal terminal CK2 of the shift register circuit in an (N+1)-th stage are connected to the second clock signal CLK2 and the first clock signal CLK1, respectively; cycles of the first clock signal CLK1 and the second clock signal CLK2 are the same, and their timing sequences are opposite.

Figure 7:
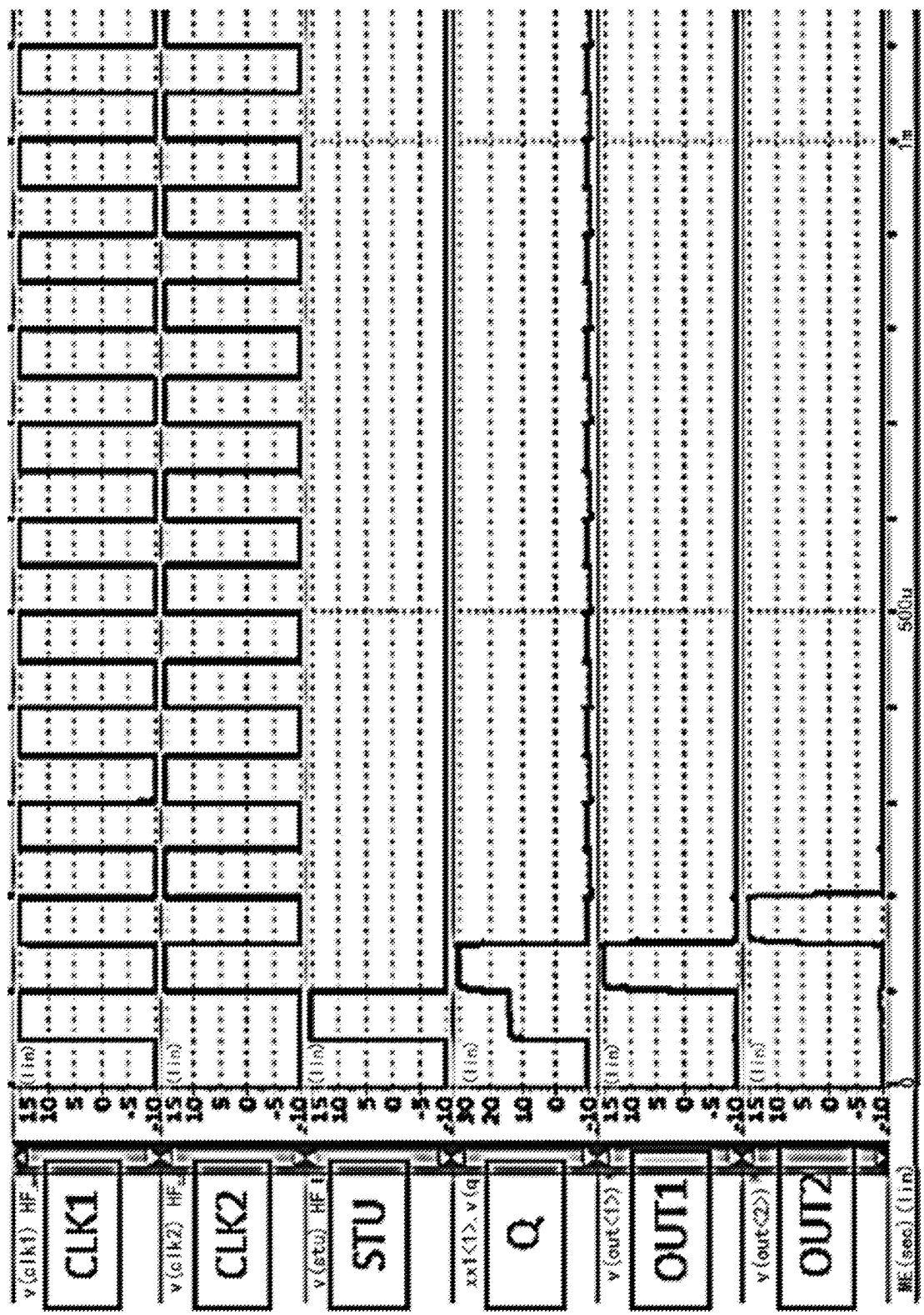
FIG. 7 is a simulation diagram of a gate driving circuit having shift register circuits cascaded in two stages according to an embodiment of the present disclosure.
Figure 8:
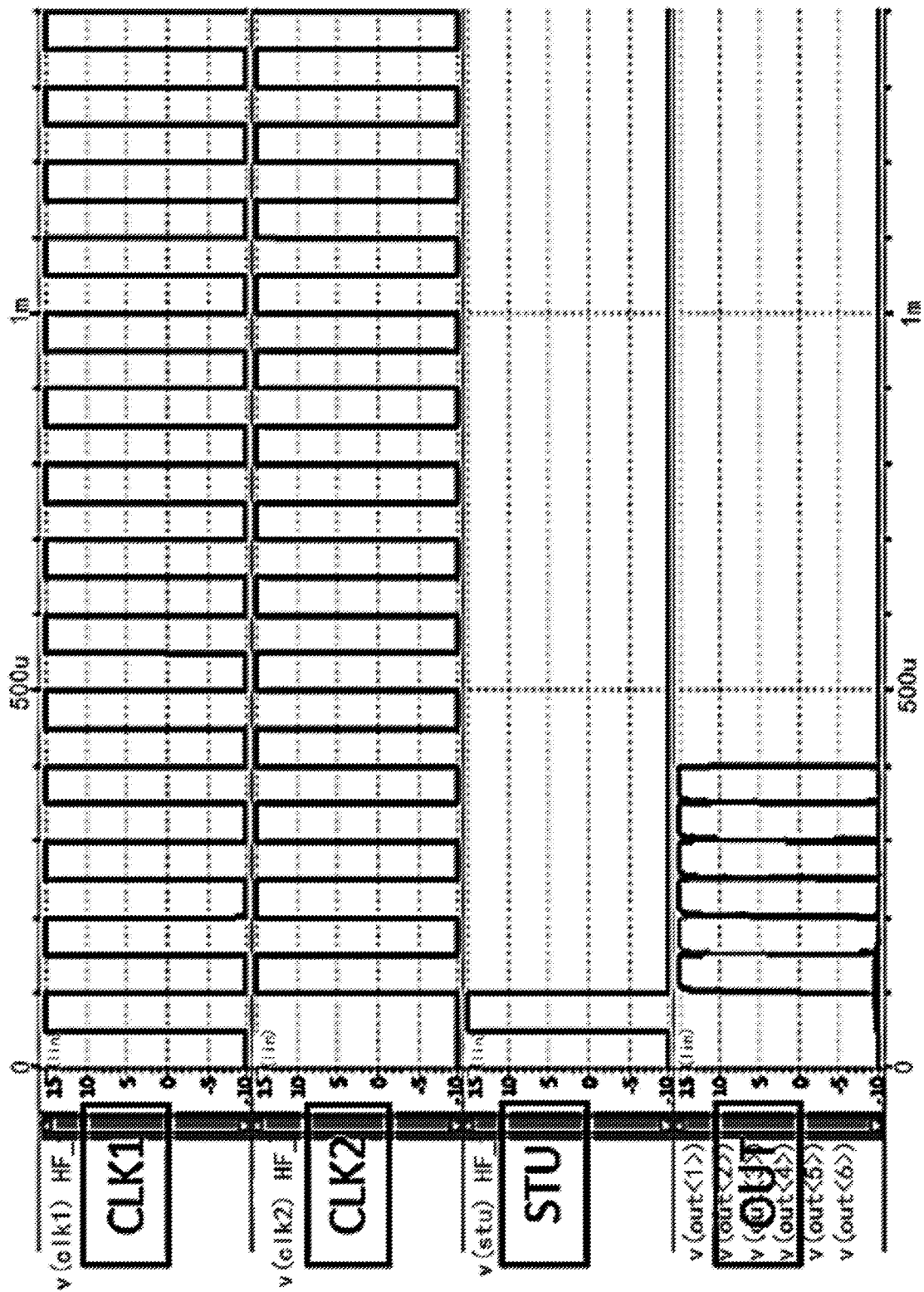
FIG. 8 is a simulation diagram of a gate driving circuit having shift register circuits cascaded in six stages according to an embodiment of the present disclosure.

As shown in FIG. 6, taking the shift register circuit in an N-th stage as an example, the output terminal OUTPUT of the shift register circuit in the N-th stage is connected to the N-th gate line GL(N), and the input terminal INPUT of the shift register circuit in the N-th stage is connected to the output signal OUT_N−1 of the shift register circuit in the (N−1)-th stage, the reset terminal RESET of the shift register circuit in the N-th stage is connected to the output signal OUT_N+1 of the shift register circuit in the (N+1)-th stage. Referring to the signal timing shown in FIG. 3, when the output signal OUT_N−1 of the shift register circuit in the (N−1)-th stage becomes a high level, the input terminal INPUT of the shift register circuit in the N-th stage is input with the input signal OUT_N−1 of a high level, so that the level at the pull-up node Q of the shift register circuit in the N-th stage increases, the level at the pull-down node QB is reset, and the output terminal OUTPUT outputs the output signal OUT_N of a low level. When the output signal OUT_N−1 of the shift register circuit in the (N−1)-th stage becomes a low level, the second clock signal terminal CK2 of the shift register circuit in the N-th stage is input with the clock signal CLK2 of a high level, so that the output terminal OUTPUT of the shift register circuit in the N-th stage outputs the output signal OUT_N of a high level. Since the output signal OUT_N of the shift register circuit in the N-th stage becomes a high level, the input terminal INPUT of the shift register circuit in the (N+1)-th stage is input with the input signal OUT_N of a high level, so that the level at the pull-up node Q of the shift register circuit in the (N+1)-th stage increases, the level at the pull-down node QB is reset, and the output terminal OUTPUT outputs the output signal OUT_N+1 of a low level. When the clock signal CLK1 of a high level is input at the second clock signal terminal CK2 of the shift register circuit in the (N+1)-th stage, the output terminal OUTPUT of the shift register circuit in the (N+1)-th stage outputs the output signal OUT_N+1 of a high level. When the input signal OUT_N+1 of a high level is input at the reset terminal RESET of the shift register circuit in the N-th stage, the level at the pull-down node QB of the shift register circuit in the N-th stage increases, and the output signal OUT_N of the output terminal OUTPUT becomes a low level. FIG. 7 is a simulation diagram of a gate driving circuit having shift register circuits cascaded in two stages according to an embodiment of the present disclosure, and FIG. 8 is a simulation diagram of a gate driving circuit having shift register circuits cascaded in six stages according to an embodiment of the present disclosure. It can be found that the circuit simulation diagram is consistent with the theoretical timing diagram through Hspice simulation, the gate driving circuit has almost a full-swing output, and almost no noise is generated when the output voltage has a low level, and power consumption is low, thereby verifying correctness of design of the present disclosure.

In the above gate driving circuit according to the present disclosure, the high level at the pull-up node Q can be maintained through the second clock signal input at the second clock signal terminal CK2 by using the first capacitor C1 connected between the pull-up node Q and the second clock signal terminal CK2, so that the shift register circuit has a full-swing output, low power consumption, and low noise; in the blanking time after a frame of scanning ends, the level at the pull-down node QB can be pulled down through the reverse bias voltage input at the first voltage input terminal V_R by using the second capacitor connected between the pull-down node QB and the first voltage input terminal V_R, so that the control electrode of the thin film transistor T4 connected to the output terminal OUTPUT and contained in the shift register circuit is in a negative level state, drifting of the threshold voltage of the thin film transistor T4 is restored, thereby normal display of the liquid crystal panel is maintained.

Figure 9:
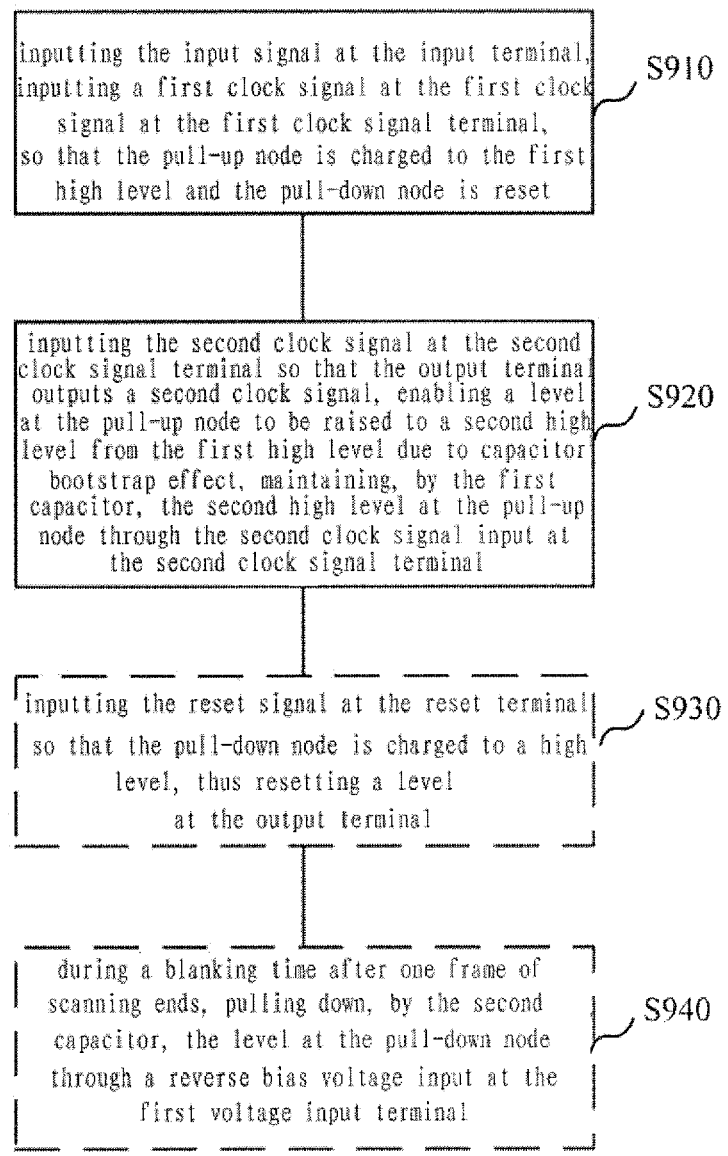
FIG. 9 is a flowchart of a driving method applied to a shift register circuit according to an embodiment of the present disclosure.

According to another aspect of the present disclosure, there is further provided a driving method applied to the shift register circuit as shown in FIG. 1. As shown in FIG. 9, the method mainly comprises the following steps: S910, inputting an input signal of a high level at the input terminal INPUT, inputting a first clock signal CLK1 of a high level at the first clock signal terminal CK1, so that the pull-up node Q is charged to the first high level, and the pull-down node QB is reset; and S920, inputting a second clock signal of a high level at the second clock signal terminal CK2 so that the output terminal OUTPUT outputs a second clock signal CLK2 of a high level, maintaining, by the first capacitor (C1), the second high level at the pull-up node Q through the second clock signal CLK2 of a high level input at the second clock signal terminal CK2.

Optionally, the driving method further comprises: S930, inputting a reset signal of a high level at the reset terminal RESET, so that the pull-down node QB is charged to a high level, and a level at the output terminal OUTPUT is reset.

Optionally, the driving method further comprises: S940, during a blanking time after a frame of scanning ends, pulling down, by the second capacitor C2, a level at the pull-down node QB through a reverse bias voltage input at the first voltage input terminal V_R.

In the driving method applied to the shift register circuit according to an embodiment of the present disclosure, the high level at the pull-up node Q can be maintained through the second clock signal input at the second clock signal terminal CK2 by using the first capacitor C1 connected between the pull-up node Q and the second clock signal terminal CK2, so that the shift register circuit has a full-swing output, low power consumption, and low noise; during a blanking time after a frame of scanning ends, the level at the pull-down node QB can be pulled down through the reverse bias voltage input at the first voltage input terminal V_R by using the second capacitor connected between the pull-down node QB and the first voltage input terminal V_R, so that the control electrode of the thin film transistor T4 connected to the output terminal OUTPUT and contained in the shift register circuit is in a negative level state, drifting of the threshold voltage of the thin film transistor T14 is restored, thereby normal display of the liquid crystal panel is maintained.

The above described merely are specific implementations of the present disclosure, but the protection scope of the present disclosure is not limited thereto. Modification and replacement easily conceivable for those skilled in the art within the technical range revealed by the embodiments of the present disclosure all fall into the protection scope of the present disclosure. Therefore, the protection scope of the present disclosure is based on the protection scope of the claims.

The present application claims priority of the Chinese Patent Application No.: 201710166678.0 filed on Mar. 20, 2017, the entire disclosure of which is hereby incorporated in full text by reference as part of the present application.

What is claimed is:

1. A shift register circuit, comprising:
   an input sub-circuit connected among an input terminal, a first clock signal terminal, a first node and a second node, and configured to charge the first node and reset the second node under control of an input signal input at the input terminal and a first clock signal input at the first clock signal terminal;
   an output sub-circuit connected among the first node, a second clock signal terminal and an output terminal, and configured to output a second clock signal input at the second clock signal terminal to the output terminal under control of a level at the first node;
   an output reset sub-circuit connected between the second node and the output terminal, and configured to reset the output terminal under control of a level at the second node; and
   a first capacitor connected between the first node and the second clock signal terminal, and configured to maintain a high level at the first node through the second clock signal input at the second clock signal terminal.

2. The shift register circuit according to claim 1, further comprising:
   a second node control sub-circuit connected between a reset terminal and the second node, and configured to charge the second node under control of a reset signal input at the reset terminal.

3. The shift register circuit according to claim 1, further comprising:
   a second capacitor connected between the second node and a first voltage input terminal, and configured to pull down a level at the second node through a reverse bias voltage input at the first voltage input terminal during a blanking time after a frame of scanning ends.

4. The shift register circuit according to claim 1, wherein the input sub-circuit comprises:
   a first transistor, a control electrode of the first transistor being connected to the first clock signal terminal, an input electrode of the first transistor being connected to the input terminal, and an output electrode of the first transistor being connected to the first node; and
   a second transistor, a control electrode of the second transistor being connected to the first node, an input electrode of the second transistor being connected to a second voltage input terminal, and an output electrode of the second transistor being connected to the second node.

5. The shift register circuit according to claim 1, wherein the output sub-circuit comprises:
   a third transistor, a control electrode of the third transistor being connected to the first node, an input electrode of the third transistor being connected to the second clock signal terminal, and an output electrode of the third transistor being connected to the output terminal; and a third capacitor connected between the first node and the output terminal.

6. The shift register circuit according to claim 1, wherein the output reset sub-circuit comprises:
a fourth transistor, a control electrode of the fourth transistor being connected to the second node, an input electrode of the fourth transistor being connected to the second voltage input terminal, and an output electrode of the fourth transistor being connected to the output terminal.

7. The shift register circuit according to claim 2, wherein the second node control sub-circuit comprises:
a fifth transistor, a control electrode and an input electrode of the fifth transistor being connected to the reset terminal, and an output electrode of the fifth transistor being connected to the second node.

8. A gate driving circuit, comprising a plurality of stages of cascaded shift register circuits according to claim 1, wherein the output terminal of the shift register circuit in each stage is connected to a corresponding gate line,
the output terminal of the shift register circuit in a first stage is connected to the input terminal of the shift register circuit in a second stage, the output terminal of the shift register circuit in a last stage is connected to the reset terminal of the shift register circuit in the last but one stage; except the shift register circuit in the first stage, the output terminal of the shift register circuit in each stage is further connected to the reset terminal of the shift register circuit in a previous stage; except the shift register circuit in the last stage, the output terminal of the shift register circuit in each stage is further connected to the input terminal of the shift register circuit in a next stage;
the first clock signal terminal and the second clock signal terminal of the shift register circuit in an N-th stage are input at the first clock signal and the second clock signal, respectively, and the first clock signal terminal and the second clock signal terminal of the shift register circuit in an (N+1)-th stage are input at the second clock signal and the first clock signal, respectively;
cycles of the first clock signal and the second clock signal are the same, and timing sequences of the first clock signal and the second clock signal are opposite.

9. The shift register circuit according to claim 2, wherein the input sub-circuit comprises:
a first transistor, a control electrode of the first transistor being connected to the first clock signal terminal, an input electrode of the first transistor being connected to the input terminal, and an output electrode of the first transistor being connected to the first node; and
a second transistor, a control electrode of the second transistor being connected to the first node, an input electrode of the second transistor being connected to a second voltage input terminal, and an output electrode of the second transistor being connected to the second node.

10. The shift register circuit according to claim 3, wherein the input sub-circuit (101) comprises:
a first transistor, a control electrode of the first transistor being connected to the first clock signal terminal, an input electrode of the first transistor being connected to the input terminal, and an output electrode of the first transistor being connected to the first node; and
a second transistor, a control electrode of the second transistor being connected to the first node, an input electrode of the second transistor being connected to a second voltage input terminal, and an output electrode of the second transistor being connected to the second node.

11. The shift register circuit according to claim 2, wherein the output sub-circuit (102) comprises;
a third transistor, a control electrode of the third transistor being connected to the first node, an input electrode of the third transistor being connected to the second clock signal terminal, and an output electrode of the third transistor being connected to the output terminal; and
a third capacitor connected between the first node and the output terminal.

12. The shift register circuit according to claim 3, wherein the output sub-circuit (102) comprises:
a third transistor, a control electrode of the third transistor being connected to the first node, an input electrode of the third transistor being connected to the second clock signal terminal, and an output electrode of the third transistor being connected to the output terminal; and
a third capacitor connected between the first node and the output terminal.

13. The shift register circuit according to claim 4, wherein the output sub-circuit comprises:
a third transistor, a control electrode of the third transistor being connected to the first node, an input electrode of the third transistor being connected to the second clock signal terminal, and an output electrode of the third transistor being connected to the output terminal; and
a third capacitor connected between the first node and the output terminal.

14. The shift register circuit according to claim 2, wherein the output reset sub-circuit comprises:
a fourth transistor, a control electrode of the fourth transistor being connected to the second node, an input electrode of the fourth transistor being connected to the second voltage input terminal, and an output electrode of the fourth transistor being connected to the output terminal.

15. The shift register circuit according to claim 3, wherein the output reset sub-circuit comprises:
a fourth transistor, a control electrode of the fourth transistor being connected to the second node, an input electrode of the fourth transistor being connected to the second voltage input terminal, and an output electrode of the fourth transistor being connected to the output terminal.

16. The shift register circuit according to claim 4, wherein the output reset sub-circuit comprises:
a fourth transistor, a control electrode of the fourth transistor being connected to the second node, an input electrode of the fourth transistor being connected to the second voltage input terminal, and an output electrode of the fourth transistor being connected to the output terminal.

17. A driving method for driving a shift register circuit, the shift register circuit comprises: an input sub-circuit connected among an input terminal, a first clock signal terminal, a first node and a second node; an output sub-circuit connected among the first node, a second clock signal terminal and an output terminal; an output reset sub-circuit connected between the second node and the output terminal; and a first capacitor connected between the first node and the second dock signal terminal,
the driving method comprising:

inputting the input signal at the input terminal, inputting the first clock signal at the first clock signal terminal, so that the first node is charged to a first high level, and the second node is reset; and inputting the second clock signal at the second clock signal terminal so that the output terminal outputs the second clock signal, enabling a level at the first node to be raised from the first high level to a second high level due to capacitor bootstrap effect, maintaining, by the first capacitor, the second high level at the first node through the second clock signal input at the second clock signal terminal.

18. The driving method according to claim 17, wherein the shift register circuit further comprises a second node control sub-circuit connected between the reset terminal and the second node, and the driving method further comprises:

inputting a reset signal at the reset terminal so that the second node is charged to a high level, thus resetting a level at the output terminal.

19. The driving method according to claim 17, wherein the shift register circuit further comprises a second capacitor connected between the second node and the first voltage input terminal, the driving method further comprises:

during a blanking time after a frame of scanning ends, pulling down, by the second capacitor, the level at the second node through a reverse bias voltage input at the first voltage input terminal.

20. The driving method according to claim 18, wherein the shift register circuit further comprises a second capacitor connected between the second node and the first voltage input terminal, the driving method further comprises:

during a blanking time after a frame of scanning ends, pulling down, by the second capacitor, the level at the second node through a reverse bias voltage input at the first voltage input terminal.

* * * * *